(12) United States Patent
Goudard

(10) Patent No.: US 6,359,330 B1
(45) Date of Patent: Mar. 19, 2002

(54) OPTOELECTRONIC MODULE AND METHOD FOR STABILIZING ITS TEMPERATURE

(75) Inventor: Jean-Luc Goudard, Thiais (FR)

(73) Assignee: Alcatel, Paris (FR)

(\*) Notice: Subject to any disclaimer, the term of this patent is extended or adjusted under 35 U.S.C. 154(b) by 0 days.

(21) Appl. No.: 09/317,222

(22) Filed: May 24, 1999

(30) Foreign Application Priority Data

May 25, 1998 (EP) .............................. 98440107

(51) Int. Cl.⁷ ............................................... H01L 23/48
(52) U.S. Cl. ......................................... 257/678; 381/89
(58) Field of Search ............................. 257/678; 381/89, 381/90, 91

(56) References Cited

U.S. PATENT DOCUMENTS 6,227,724 B1 \* 5/2001 Verdiell ....................... 385/91

FOREIGN PATENT DOCUMENTS

EP 0 259 888 A2 3/1988
EP 0 816 884 A1 1/1998

OTHER PUBLICATIONS

Tsuyoshi Hayashi et al, "Thermal Interaction in a Distributed–Feedback laser Diode (DFB LD) Array Module", Journal of Lightwave Technology, vol. 11, No. 3, Mar. 1, 1993, pp. 442–447, XP000372714.
Patent Abstracts of Japan, vol. 016, No. 360 (E–1243), Aug. 4, 1992 corresponding to JP 04 112591 A (Fujitsu Ltd) date Apr. 14, 1992.

\* cited by examiner

Primary Examiner—Eddie Lee
Assistant Examiner—Lourdes Cruz
(74) Attorney, Agent, or Firm—Sughrue Mion, PLLC

(57) ABSTRACT

An optoelectronic module and a method for stabilizing its temperature are disclosed wherein the measurement of the reference temperature for the temperature sensor takes place on the substrate surface for the optoelectronic component, so that high temperature stability is ensured.

2 Claims, 1 Drawing Sheet

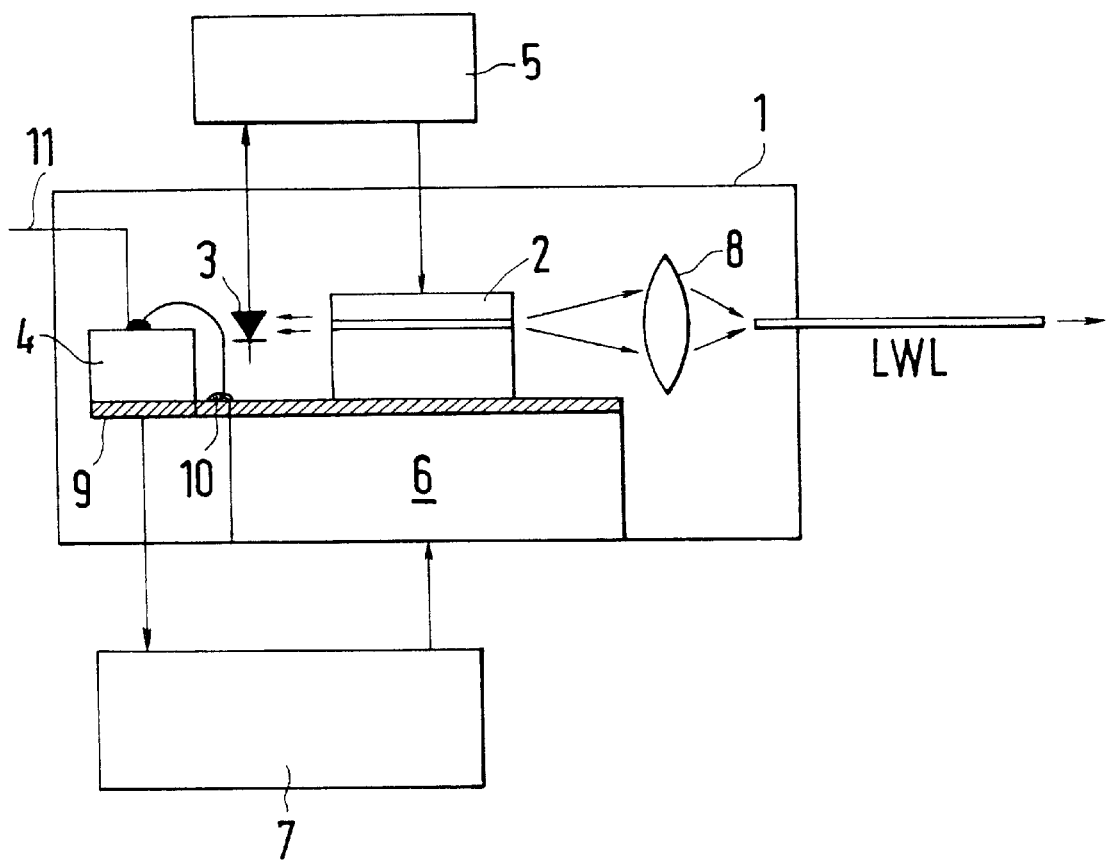

OPTOELECTRONIC MODULE AND METHOD FOR STABILIZING ITS TEMPERATURE

BACKGROUND OF THE INVENTION

This invention relates to an optoelectronic module and to a method for stabilizing its temperature as set forth in the preambles of the respective independent claims.

From the prior art, for example from EP 0259888, it is known to design optoelectronic modules in such a way that the individual optoelectronic components, such as laser diodes or photodiodes, can be temperature-stabilized. To accomplish this, the active elements, which are formed or mounted on a substrate, are mounted by means of this substrate on a Peltier element, for example. To stabilize the output power and current consumption of, e.g., a laser diode, the substrate with the laser diode is cooled. A thermistor, which also rests on the substrate, is used as a sensor for the Peltier element. The thermistor requires a reference temperature to keep the temperature of the substrate, and thus of the laser diode, for example, stable. So far it has been usual to connect the thermistor directly to the housing by an electric connection. The temperature measurement of the thermistor thus takes place at the housing wall. Such a measurement may result in wrong temperature information being processed, since the housing has a temperature different from that of the substrate.

SUMMARY OF THE INVENTION

The optoelectronic module according to the invention, with the characterizing features of the first independent claim, has the advantage that the temperature measurement takes place directly on the substrate. The thermistor is connected to the substrate by an electric connection, and the temperature measurement takes place on the substrate, and thus close to the laser diode or photodiode. The extra cost of an additional electric wire connection is offset by the advantages of the assembly. The advantage is a temperature setting at the location of the laser diode itself, based on a temperature measurement which is also made at the location of the laser diode. This makes it possible to achieve very high temperature stability and thus ensure laser stability, which is of great importance for the transmission of high data rates.

By the method according to the invention, with the characterizing features of the second independent claim, temperature control is possible with a high degree of accuracy.

One embodiment of the invention will now be explained in detail with reference to the accompanying drawing showing schematically the construction of an optoelectronic module according to the invention.

The figure shows schematically the construction of an optoelectronic module with a housing 1. Inside the housing, a laser diode 2 and a thermistor 4 are mounted on a substrate 9. The substrate 9 rests flat on a Peltier element 6. Indicated beside the laser diode 2 is a monitor photodiode 3 which has an electric connection to a current regulator 5 which in turn is connected to the laser 2. The light emitted by the laser diode 2 is concentrated by a lens 8 and launched into an optical fiber LWL. The thermistor 4 is connected by an electric line to a point 10 on the substrate. Its electric lead 11 is brought out through the housing. The thermistor is connected to a temperature controller 7 which in turn is connected to the Peltier element 6. In this embodiment, the idea of the invention was implemented by connecting the thermistor 4 via an additional electric line to the measuring point 10. This additional electric line permits the reference temperature to be determined at the point 10 rather than at the point where the electric lead 11 is fed through the wall of the housing 1, as is customary in the prior art. With the assembly according to the invention, temperature stabilization at the location of the laser diode is possible with a very high degree of accuracy. The stabilization no longer depends on the temperature of the air surrounding the housing. A high stability of the laser temperature can thus be achieved, thus ensuring the stability necessary for the transmission of high data rates. The same principle can also be applied to other optoelectronic modules that require temperature stabilization.

The stabilization no longer depends on the temperature of the air surrounding the housing. A high stability of the laser temperature can thus be achieved, thus ensuring the stability necessary for the transmission of high data rates. The same principle can also be applied to other optoelectronic modules that require temperature stabilization.

What is claimed is:

1. An optoelectronic module with a housing (1) containing at least one optoelectronic component (2) to be thermally stabilized, said optoelectronic component (2) being formed or mounted on a substrate (9) and connected to temperature-stabilizing means (6), the temperature being measured by means of an electrical component (6) on the substrate (9), characterized in that the electrical component (4) has a direct electric connection to a point (10) on the substrate (9), and that said point (10) serves as a temperature reference.

2. An optoelectronic module as claimed in claim 1, characterized in that the electrical component is thermistor.

* * * * *